(12) United States Patent
Uchida

(10) Patent No.: US 10,660,213 B2
(45) Date of Patent: May 19, 2020

(54) ADHESIVE-ATTACHED COPPER FOIL, COPPER-CLAD LAMINATE, AND WIRING SUBSTRATE

(71) Applicant: KYOCERA Corporation, Kyoto-shi, Kyoto (JP)

(72) Inventor: Kazumichi Uchida, Yokohama (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 16/584,733

(22) Filed: Sep. 26, 2019

(65) Prior Publication Data

US 2020/0029442 A1    Jan. 23, 2020

Related U.S. Application Data

(63) Continuation of application No. PCT/JP2018/000824, filed on Jan. 15, 2018.

(51) Int. Cl.
*H05K 3/02* (2006.01)
*H05K 3/38* (2006.01)

(52) U.S. Cl.
CPC ............. *H05K 3/022* (2013.01); *H05K 3/389* (2013.01)

(58) Field of Classification Search
CPC ............................... H05K 3/022; H05K 3/389
USPC ........................................................ 174/257
See application file for complete search history.

(56) References Cited

U.S. PATENT DOCUMENTS

| | | | | |
|---|---|---|---|---|
| 5,177,156 A | * | 1/1993 | Aritomi | ............... C08G 65/485 525/100 |
| 2004/0209109 A1 | | 10/2004 | Tsuchida et al. | |
| 2004/0241487 A1 | | 12/2004 | Nagatani | |
| 2012/0037410 A1 | * | 2/2012 | Amou | ....................... B32B 7/02 174/258 |
| 2017/0164469 A1 | | 6/2017 | Kitai et al. | |

FOREIGN PATENT DOCUMENTS

| | | |
|---|---|---|
| CN | 104041198 A | 9/2014 |
| JP | 2003-201585 A | 7/2003 |
| JP | 2005-008829 A | 1/2005 |
| JP | 2005-015613 A | 1/2005 |
| JP | 4178415 B2 | 11/2008 |
| JP | WO2013/105650 A1 | 7/2013 |
| JP | 2016-028885 A | 3/2016 |

* cited by examiner

*Primary Examiner* — Sherman Ng
(74) *Attorney, Agent, or Firm* — Volpe and Koenig, P.C.

(57) ABSTRACT

There are provided a wiring substrate having a low dielectric constant and a low dielectric loss tangent, and an adhesive-attached copper foil and a copper-clad laminate that are suitable for manufacture of the wiring substrate and have improved adhesiveness to a copper foil. An adhesive-attached copper foil includes: a copper foil on one surface; and an adhesive layer provided on one surface of the copper foil, in which this copper foil has a roughened surface that is surface-treated by methacrylic silane, acrylic silane, or isocyanurate silane, and the adhesive layer is formed on the roughened surface and is made of a resin composition containing, as a main component thereof, modified polyphenylene ether resulting from modification of a hydroxyl group present at the end of the main chain with an ethylenically unsaturated compound.

9 Claims, 1 Drawing Sheet

ADHESIVE-ATTACHED COPPER FOIL, COPPER-CLAD LAMINATE, AND WIRING SUBSTRATE

CROSS-REFERENCE TO RELATED APPLICATIONS

This application is a continuation of prior International Application No. PCT/JP2018/000824, filed on Jan. 15, 2018 which is based upon and claims the benefit of priority from Japanese Patent Application No. 2017-063283, filed on Mar. 28, 2017; the entire contents of all of which are incorporated herein by reference.

FIELD

The present invention relates to an adhesive-attached copper foil, a copper-clad laminate, and a wiring substrate, and particularly relates to a wiring substrate having a low dielectric constant and a low dielectric loss tangent, and an adhesive-attached copper foil and a copper-clad laminate that are suitable for manufacture of the wiring substrate.

BACKGROUND

In recent years, speeding up and high integration of LSIs, large capacity of memories, and so on have been in progress, and with this, miniaturization, reduction in weight, thinning, and the like of various electronic components have been in progress rapidly. Therefore, materials are also required to have more excellent heat resistance, dimensional stability, electric properties, and so on.

Conventionally, thermosetting resins such as a phenol resin, an epoxy resin, and a polyimide resin have been used for printed wiring substrates. These resins have various performances in a balanced manner but have a poor dielectric property in a high-frequency range.

As a new material to solve this problem, polyphenylene ether attracts attention, and application of polyphenylene ether to a copper-clad laminate has been attempted (refer to JP-A 2005-008829). Further, in recent years, application of a product made by forming an alloy layer and a silane coupling agent adsorption layer on a copper foil surface has also been examined in order to correspond to a fine pitch of a circuit (refer to JP-B 4178415, JP-A 2003-201585).

SUMMARY

However, in recent years, reducing a dielectric constant and a dielectric loss tangent in a higher-frequency range has been required. Therefore, the polyphenylene ether has also been required to further reduce the dielectric constant and the dielectric loss tangent in such a high-frequency range. However, the polyphenylene ether has small high polar functional groups contributing to adhesion, and thus the bonding property between a copper foil and a resin cured layer tends to decrease, resulting in that there is increasing a demand for a low dielectric substrate having a high adhesive force.

An object of the present invention is to provide a wiring substrate having a low dielectric constant and a low dielectric loss tangent. Further, an object of the present invention is to provide an adhesive-attached copper foil and a copper-clad laminate that are suitable for manufacture of such a wiring substrate and have improved adhesiveness to a copper foil.

The adhesive-attached copper foil of the present invention is an adhesive-attached copper foil including: a copper foil having a roughened surface on one surface of the copper foil, the roughened surface having a silane coupling agent layer surface-treated by methacrylic silane, acrylic silane or isocyanurate silane; and an adhesive layer formed on the roughened surface and made of a resin composition containing, as a main component thereof, modified polyphenylene ether resulting from modification of a hydroxyl group present at the end of the main chain with an ethylenically unsaturated compound.

The copper-clad laminate of the present invention is a copper-clad laminate including: a copper foil having a roughened surface on one surface of the copper foil, the roughened surface having a silane coupling agent layer surface-treated by methacrylic silane, acrylic silane, or isocyanurate silane; and the prepreg laminated on the roughened surface and made by impregnating a glass cloth with a resin composition containing, as a main component thereof, modified polyphenylene ether resulting from modification of a hydroxyl group present at the end of the main chain with an ethylenically unsaturated compound.

The wiring substrate of the present invention includes the above-described copper-clad laminate of the present invention in which copper foil is processed into a wiring pattern.

According to the wiring substrate of the present invention, it is possible to obtain a wiring substrate suitable for a high frequency that has a low dielectric constant and a low dielectric loss tangent and has excellent adhesiveness to a copper foil. Further, the adhesive-attached copper foil and the copper-clad laminate of the present invention are materials suitable for manufacturing the above-described wiring substrate.

DETAILED DESCRIPTION

Hereinafter, the present invention will be explained with reference to one embodiment.

[Adhesive-Attached Copper Foil]

Figure 1:
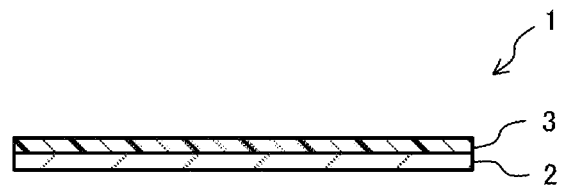
FIG. 1 is a cross-sectional view illustrating a schematic formation of an adhesive-attached copper foil that is one embodiment of the present invention.

As illustrated in FIG. 1, an adhesive-attached copper foil 1 in this embodiment has a copper foil 2 and an adhesive layer 3 provided on one surface of the copper foil 2. The adhesive-attached copper foil 1 is bonded to a resin base (prepreg or the like), and thereby a laminate member having the copper foil on surfaces of the resin base (copper-clad laminate or the like) is obtained. A multilayer board (wiring substrate or the like) can also be formed by processing this laminate member into an inner layer circuit board and further overlaying the adhesive-attached copper foils 1 thereon to make a multilayer. Hereinafter, there will be explained respective components of the adhesive-attached copper foil.

(Copper Foil)

The copper foil used in this embodiment is not limited in particular as long as it is a copper foil to be used as a material of a circuit board and the like of an electronic component, and as this copper foil, for example, either an electrolytic copper foil or a rolled copper foil may be used and its type and the like are not limited. Further, one surface of this copper foil is roughened. Here, in this description, "roughening" means forming irregularities on the surface of the copper foil, and the roughening is performed, for example, in a manner that as for the electrolytic copper foil, a copper foil is obtained so as to dare to make the opposite surface to a glossy surface rough and small irregularities are further formed on the rough surface, or by a well-known method such as a blast process, an uneven surface is formed on one surface of the rolled copper foil having smooth surfaces.

Further, the thickness of this copper foil preferably falls within a range of 5 to 70 μm, and in the electrolytic copper foil, surface roughness Rz of the roughened surface of the copper foil preferably falls within a range of 2 to 20% of the thickness of the copper foil. Further, this surface roughness Rz is preferably set to 0.1 to 2.0 μm. Here, the surface roughness Rz indicates the maximum height in JIS B0601: 2001. Incidentally, the above-described roughened surface is what is called a matte surface and the surface opposite thereto is a smooth surface (glossy surface).

The above-described roughened surface of the copper foil used in this embodiment is a bonding surface, and in the adhesive-attached copper foil, the surface on which the adhesive layer is provided and the roughened surface are the same. Here, in this description, the "bonding surface" indicates a surface of the copper foil to be bonded to the resin base and indicates the surface on which the adhesive layer is provided. In the adhesive-attached copper foil according to this embodiment, regardless of the type of a copper foil such as the electrolytic copper foil or the rolled copper foil, the bonding surface is roughened and the adhesive layer is provided between this roughened surface of the copper foil and the resin base, and thereby a sufficient adhesive strength between the copper foil and the resin base can be obtained.

That is, the adhesive-attached copper foil according to this embodiment can obtain a sufficient adhesive strength to the resin base in spite of being what is called a low profile copper foil, and thus it is not necessary to fuse the surface of the copper foil when a conductor pattern is formed by etching as before, resulting in that it is possible to reduce the time required for etching. Therefore, it becomes possible to form a circuit having a good etching factor. From the viewpoint of forming a much finer circuit, the surface roughness Rz of the copper foil is more preferred to be 1.5 μm or less and further preferred to be 1.0 μm or less.

Further, this embodiment employs a formation in which one surface (the roughened surface) of the copper foil is surface-treated by a silane coupling agent to form a silane coupling agent layer, and on the surface of this silane coupling agent layer, the later-described adhesive layer is provided. The adhesive layer is provided on the surface of the copper foil with the silane coupling agent layer provided therebetween, and thereby wettability between the surface of the copper foil and the adhesive layer improves, resulting in that it is possible to improve the adhesive strength when the adhesive-attached copper foil is bonded to the resin base and further improve bonding adhesion. Then, the silane coupling agent layer is provided therebetween, thereby making it possible to make the copper foil adhere to the later-described resin base (prepreg) more tightly as compared to the case where the silane coupling agent layer does not exist.

In forming the silane coupling agent layer, preferably, a solution made by dissolving 0.5 to 10 g/L of a silane coupling agent in a water as a solvent is brought into contact with the surface of the copper foil uniformly at a temperature of a room temperature level by a dipping method, a showering method, an atomizing method, or the like and the silane coupling agent is uniformly adsorbed on the surface of the copper foil. The silane coupling agent is condensation-bonded to the OH groups projecting on the surface of the copper foil, to thereby form a coating film.

The case of using a solution with the concentration of the silane coupling agent being less than 0.5 g/L is not preferred because the adsorption speed of the silane coupling agent on the surface of the copper foil is slow, which is commercially unprofitable generally. Further, it is not preferred because the silane coupling agent is adsorbed on the surface of the copper foil ununiformly. Further, the case where the concentration of the silane coupling agent exceeds 10 g/L is not preferred from the economic viewpoint because such an effect as an improvement in the adsorption speed or uniformity in particular is not further enhanced.

As the silane coupling agent, a commercially available epoxy-based or amino-based silane coupling agent has been used for a long time because it is effective for an epoxy-based base, but regarding the recent response to the higher frequency, the case where the epoxy-based or amino-based silane coupling agent fails to satisfy required properties such as peel strength and heat resistance is on the increase. Therefore, in this embodiment, when methacrylic silane, acrylic silane, or isocyanurate silane is used as the silane coupling agent, the peel strength and the heat resistance improve and a high-frequency property improves.

Incidentally, this embodiment may employ a formation in which before the silane coupling agent treatment, the surface (roughened surface) of the copper foil is rust-proofed and thereafter, the silane coupling agent treatment is performed, and the adhesive layer is further provided on the surface on which this rust-proofed layer and the silane coupling agent layer are formed. Examples of the rust proofing on the copper foil include inorganic rust proofing using zinc, nickel, cobalt, and so on, a chromate treatment using chromate, organic rust proofing using an organic agent such as benzotriazole or imidazole, and so on. In this embodiment, in the case where the "copper foil" is mentioned simply below, the rust-proofed copper foil is also included.

(Adhesive Layer)

The adhesive layer used here is provided on one surface of the copper foil and is made of a resin composition containing, as its main component, modified polyphenylene ether resulting from modification of a hydroxyl group present at the end of the main chain with an ethylenically unsaturated compound.

The modified polyphenylene ether used here is a compound resulting from modification of a hydroxyl group present at the end of the main chain of polyphenylene ether with an ethylenically unsaturated compound, and reduces a dielectric constant and a dielectric loss tangent in a cured product of the resin composition.

As this resin composition, more specifically, a resin composition containing (A) modified polyphenylene ether resulting from modification of a hydroxyl group present at the end of the main chain with an ethylenically unsaturated compound, (B) cyanurate compound containing at least one type of triallyl isocyanurate and triallyl cyanurate, and (C) organic peroxide is preferred. There will be concretely explained respective components below.

The modified polyphenylene ether (A) used in this embodiment preferably contains polyphenylene ether represented by the following general formula (I), for example.

[Chemical formula 1]

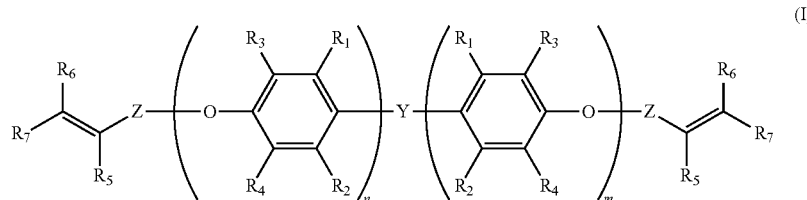

(I)

where in the general formula (I), $R_1$ to $R_7$ are independently a hydrogen atom, a straight-chain or branched-chain alkyl group having a carbon number of 1 to 8, a straight-chain or branched-chain alkenyl group having a carbon number of 2 to 8, a straight-chain or branched-chain alkynyl group having a carbon number of 2 to 8, or an aryl group having a carbon number of 6 to 10, Y is an oxygen atom, a methylene group, or a dimethylmethylene group, Z is a carbonyl group, a thiocarbonyl group, a methylene group, an ethylene group, a trimethylene group, or a tetramethylene group, n is an integer of 1 to 100, m is an integer of 1 to 100, and n+m is an integer of 2 to 200.

Incidentally, an organic group containing carbon atoms of $R_1$ to $R_7$ in the above-described general formula (I) may further have a substituent, and examples of this substituent include a carboxyl group, an aldehyde group, a hydroxyl group, an amino group, and so on.

$R_1$ to $R_7$ are preferred to be a hydrogen atom, a methyl group, an ethyl group, or a phenyl group independently. Here, the phenyl group may further have a substituent. This substituent is the same as the above-described substituent.

The content of the modified polyphenylene ether (A) is preferred to be 29.9 to 90 mass % when the total content of the modified polyphenylene ether (A), the cyanurate compound (B), and the organic peroxide (C) is set to 100 mass %. The content is made to fall within this range, thereby making it possible to reduce the dielectric constant and the dielectric loss tangent of a cured product obtained by using this resin composition. Further, the content of the modified polyphenylene ether (A) is more preferred to be 40 to 75 mass %.

The cyanurate compound (B) used in this embodiment contains at least one type selected from triallyl isocyanurate and triallyl cyanurate, and functions as a crosslinking agent to crosslink the modified polyphenylene ether (A). The cyanurate compound (B) may use each of triallyl isocyanurate and triallyl cyanurate independently, or may use them in combination. Using at least one type of compound selected from triallyl isocyanurate and triallyl cyanurate makes it possible to obtain a cured product having excellent dielectric property and heat resistance. It is preferred to use triallyl isocyanurate out of them.

As this cyanurate compound (B), a commercial product can be used. As a commercial product of triallyl isocyanurate, for example, TAICROS (produced by Evonik Degussa Co., Ltd., product name; the content of diallyl isocyanurate: 100 to 400 ppm), and so on are cited. Further, from the viewpoint of suppressing the decrease in heat resistance, the diallyl isocyanurate contained in the triallyl isocyanurate as an impurity is preferred to be 500 ppm or less. This is true of the triallyl cyanurate.

The content of the cyanurate compound (B) is preferred to be 9.9 to 70 mass % when the total content of the modified polyphenylene ether (A), the cyanurate compound (B), and the organic peroxide (C) is set to 100 mass %. The content is made to fall within this range, thereby making it possible to obtain a cured product having high heat resistance. Further, the content of the cyanurate (B) compound is more preferred to be 20 to 50 mass %.

The organic peroxide (C) used in this embodiment is a compound working as a radical initiator. The organic peroxide (C) is a compound that generates a radical under a mild condition and promotes a polymerization reaction for polymerizing the modified polyphenylene ether (A) and the cyanurate compound (B) through a radical reaction and obtaining a polymer (crosslinked product) of them.

The organic peroxide (C) only needs to be organic peroxide functioning as a well-known radical initiator, and is not limited in particular. Examples of such organic peroxide include di-t-butyl peroxide, 2,5-dimethyl-2,5-di(t-butyl peroxide)hexane, 2,5-dimethyl-2,5-di(t-butyl peroxide)hexyne-3, t-butyl cumyl peroxide, α,α'-di-(t-butylperoxy)diisopropylbenzene, t-butylperoxybenzoate, and so on.

As the organic peroxide (C), a commercial product can be used. Examples of such a product include "PERBUTYL D," "PERHEXA 25B," "PERHEXYNE 25B," "PERBUTYL C," "PERBUTYL P," and "PERBUTYL Z," (which are each produced by NOF CORPORATION), and so on.

Incidentally, the organic peroxide (C) preferably has a structure not having a benzene ring. Not having the benzene ring makes it possible to reduce the dielectric loss tangent more efficiently.

The content of the organic peroxide (C) is preferred to be 0.1 to 7 mass % when the total content of the modified polyphenylene ether (A), the cyanurate compound (B), and the organic peroxide (C) is set to 100 mass %. The content is made to fall within this range, thereby making it possible to obtain a cured product having high heat resistance. Further, the content of the organic peroxide (C) is more preferred to be 0.5 to 5 mass %.

As the resin composition in this embodiment, the above-described components of (A) to (C) are preferred to be combined, but it is further preferred to contain a butadiene.styrene copolymer (D) to be explained next.

The butadiene.styrene copolymer (D) used in this embodiment is a copolymer obtained by polymerizing butadiene and styrene, and is a component that reacts with the (A) modified polyphenylene ether and the cyanurate compound (B) to form a polymer (crosslinked product). Concretely, a double bond present in the butadiene.styrene copolymer (D) and double bonds present in the (A) modified polyphenylene ether and the cyanurate compound (B) react and polymerize.

The butadiene.styrene copolymer (D) is preferred to be one obtained by polymerizing butadiene and styrene at a mass ratio (butadiene/styrene) of 50/50 to 90/10. When the mass ratio is 50/50 to 90/10, it is possible to increase the adhesiveness to the copper foil. Incidentally, this mass ratio is more preferably 50/50 to 80/20 and further preferably 50/50 to 70/30 from the viewpoint of the dielectric loss tangent or the like.

The weight-average molecular weight and the number average molecular weight of the butadiene.styrene copolymer (D) are not limited in particular, and an oligomer having a relatively low polymerization degree (a small molecular weight) can also be used. Incidentally, as the butadiene.styrene copolymer (D), one having a weight-average molecular weight of about 1,000 to 10,000 can be used normally.

The content of the butadiene.styrene copolymer (D) is preferred to be 0.5 to 20 mass % when the total content of the modified polyphenylene ether (A), the cyanurate compound (B), the organic peroxide (C), and the butadiene.styrene copolymer (D) is set to 100 mass %. The content is made to fall within this range, thereby making it possible to reduce the dielectric constant and the dielectric loss tangent of an electronic component and increase the adhesiveness to the copper foil. The content of the butadiene.styrene copolymer (D) is more preferred to be 3 to 15 mass %.

The resin composition used in this embodiment may further contain a solvent as necessary within a range not to depart from the scope of the present invention. Here, the solvent is used as a solvent for dissolving or dispersing the respective components of (A) to (D) and examples of the solvent include toluene, and so on.

This solvent is preferred to be 70 to 140 parts by mass and more preferred to be 80 to 130 parts by mass when the total content of the (A) modified polyphenylene ether, the cyanurate compound (B), the organic peroxide (C), and the butadiene.styrene copolymer (D) is set to 100 parts by mass.

The resin composition used in this embodiment can also further contain a filler, a flame retardant, a stress reducing agent, and so on as necessary within a range not to depart from the scope of the present invention.

Examples of the filler include silicas such as pulverized silica and fused silica, carbon black, titanium oxide, barium titanate, glass beads, glass hollow balls, and so on, and they may be used alone or in a combination of two or more types. As the filler, a commercial product can be used, and examples of the silica include fused silica treated with methacrylic silane: SFP-130MHM (produced by Denki Kagaku Kogyo Kabushiki Kaisha, product name), FUSELEX E-2, Adma Fine SO-C5, and PLV-3 (each produced by TATSUMORI LTD., product name), and so on.

The average particle size of the filler is preferred to be 10 μm or less. When it is 10 μm or less, it is possible to further increase the adhesiveness to the copper foil.

When the filler is compounded, its content ratio is preferred to be 5 to 40 parts by mass when the total content of the modified polyphenylene ether (A), the cyanurate compound (B), the organic peroxide (C), and the butadiene.styrene copolymer (D) is set to 100 parts by mass. The content ratio is made to fall within this content range, and thereby melt flowability of the resin composition improves, the adhesiveness to the copper foil increases, and connection reliability of through-hole conductors also increases. The filler is more preferably 10 parts by mass or more, further preferably 15 parts by mass or more, and particularly preferably 20 parts by mass or more. Further, the silica is more preferably 35 parts by mass or less.

Examples of the flame retardant include melamine phosphate, melam polyphosphate, melem polyphosphate, melamine pyrophosphate, ammonium polyphosphate, red phosphorus, aromatic phosphate, phosphonate ester, phosphinic ester, phosphine oxide, phosphazene, melamine cyanurate, and so on. These flame retardants may be used alone or in a combination of two or more types. Melamine pyrophosphate, melamine polyphosphate, melam polyphosphate, and ammonium polyphosphate are preferred out of them from the viewpoints of dielectric property, flame resistance, heat resistance, adhesiveness, moisture resistance, chemical resistance, reliability, and so on.

When the flame retardant is compounded, its content ratio is preferred to be 15 to 45 parts by mass when the total content of the modified polyphenylene ether (A), the cyanurate compound (B), the organic peroxide (C), and the butadiene.styrene copolymer (D) is set to 100 parts by mass. The content ratio is made to fall within this content range, thereby making it possible to further improve the flame resistance and the heat resistance with little or no influence on the dielectric property, the adhesiveness, and the moisture resistance of a cured product.

Examples of the stress reducing agent include silicone resin particles not having a core-shell structure, and so on. Examples of such silicone resin particles include X-52-875 and X-52-854 (produced by Shin-Etsu Chemical Co., Ltd., product name), MSP-1500 (produced by Nikko Rica Corporation, product name), MSP-3000 (produced by Nikko Rica Corporation, product name), and so on. These stress reducing agents may be used alone or in a combination of two or more types.

The average particle size of the stress reducing agent is preferred to be 10 μm or less. When it is 10 μm or less, it is possible to further increase the adhesiveness to the copper foil. Incidentally, the average particle size in this description is a 50% integrated value (50% particle size) found from a particle size distribution curve obtained by measuring a volume-based particle size distribution by using a laser diffraction•scattering method.

When the stress reducing agent is compounded, its content ratio is preferred to be 1 to 10 parts by mass when the total content of the modified polyphenylene ether (A), the cyanurate compound (B), the organic peroxide (C), and the butadiene.styrene copolymer (D) is set to 100 parts by mass. The content ratio is made to fall within this content range, thereby making it possible to further increase the adhesiveness to the copper foil and the moisture resistance of a cured product, and also increase the connection reliability of through-hole conductors.

The resin composition used in this embodiment can further contain an additive, and so on. Examples of this additive include an antioxidant, a heat stabilizer, an antistatic agent, a plasticizer, a pigment, a dye, a coloring agent, and so on. Concrete examples of the additive include R-42 (produced by Sakai Chemical Industry Co., Ltd.), IRGANOX1010 (produced by BASF), and so on. The additives may be used alone or in a combination of two or more types.

Further, the resin composition used in this embodiment can further contain at least one type of other thermoplastic resins and thermosetting resins. Examples of the thermoplastic resin include GPPS (general purpose polystyrene), HIPS (high impact polystyrene), and so on. Examples of the thermosetting resin include an epoxy resin, and so on. These resins may be used alone or in a combination of two or more types.

The resin composition used in this embodiment is obtained by mixing the components of (A) to (C), which are essential components, and the other components to be added as necessary, for example. As a mixing method, there are cited a solution mixing method of uniformly dissolving or dispersing all the components in a solvent, a melt-blending method that is carried out using an extruder or the like while heating, and so on.

[Manufacturing Method of the Adhesive-Attached Copper Foil]

The adhesive-attached copper foil 1 in this embodiment can be manufactured by applying the above-described resin composition to the bonding surface (roughened surface) of the above-described copper foil 2 and then drying the resin composition to form the adhesive layer 3. On this occasion, the resin composition can be used by being dissolved or dispersed in the above-described solvent as necessary.

As an application method used here, a well-known application method can be used without being limited in particular as long as it is capable of applying a dissolution liquid or dispersion liquid of the above-described resin composition to the bonding surface of the copper foil. As this application method, for example, application methods using a spray, a brush, a bar coater, and the like are cited.

[Copper-Clad Laminate]

Figure 2:
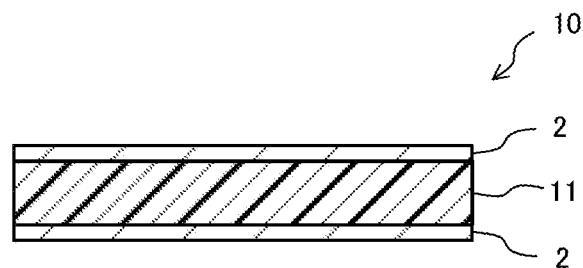
FIG. 2 is a cross-sectional view illustrating a schematic formation of a copper-clad laminate that is one embodiment of the present invention.

As illustrated in FIG. 2, a copper-clad laminate 10 being one embodiment of the present invention is formed by providing each copper foil 2 on both surfaces of a prepreg 11.

(Copper Foil)

As the copper foil 2 used here, the same one as the copper foil explained in the above-described adhesive-attached copper foil can be used. That is, it is the copper foil having the roughened surface and the silane coupling agent layer made by treating this roughened surface by a silane coupling agent. The copper foils 2 are each laminated on the prepreg 11 with each roughened surface facing the prepreg 11 side to form the copper-clad laminate.

(Prepreg)

The prepreg 11 in this embodiment is obtained by impregnating a fiber base with a resin composition containing, as its main component, modified polyphenylene ether resulting from modification of a hydroxyl group present at the end of the main chain with an ethylenically unsaturated compound.

As the resin composition here, the same one as the resin composition explained in the above-described adhesive-attached copper foil can be used.

Further, as the fiber base, a well-known base (for example, a glass cloth) can be used without being limited in particular as long as it is used for the prepreg normally, and examples of the glass cloth include ones made of materials such as D glass, S glass, and quartz glass, in addition to ordinary E glass.

The ratio of the base to the prepreg is preferably 20 to 80 mass % relative to the entire prepreg. When the ratio of the base is as above, dimensional stability and strength after the prepreg is cured are more likely to be exhibited, and further, a more excellent dielectric property is also obtained. For the prepreg according to this embodiment, a coupling agent such as a silane-based coupling agent or a titanate-based coupling agent can be used as necessary.

(Manufacturing Method of the Prepreg)

This prepreg can be manufactured by impregnating the base with the resin composition or applying the resin composition to the base in accordance with an ordinary method and then semi-curing the resin by drying.

The method of manufacturing the prepreg according to this embodiment is not limited in particular, and for example, a method is cited in which the resin composition according to this embodiment is uniformly dissolved or dispersed in a solvent (for example, an aromatic solvent, a ketone-based solvent such as acetone, or the like) as necessary and the solvent is applied to the base or the base is impregnated with the solvent to then be dried. Alternatively, the resin composition may be melted and the base may be impregnated with the melted resin composition.

The application method and the impregnating method are not particularly limited, and for example, a method of applying a dissolution liquid or dispersion liquid of the resin composition using a spray, a brush, a bar coater, or the like, a method of dipping the base in a dissolution liquid or dispersion liquid of the resin composition (dipping), and so on are cited. It is possible to repeat the application or the impregnation a plurality of times as necessary. Alternatively, it is also possible to repeat the application or the impregnation by using a plurality of dissolution liquids or dispersion liquids with different resin concentrations.

(Manufacturing Method of the Copper-Clad Laminate)

The copper-clad laminate 10 in this embodiment can be manufactured by overlaying each of the above-described copper foils 2 treated by the silane coupling agent on the above-described prepreg 11 to be formed while applying heat and pressure. This copper-clad laminate can be obtained by overlaying a plurality of the prepregs and a plurality of the copper foils with one another according to a desired thickness to be formed while applying heat and pressure, for example. Further, a thicker laminate can also be obtained by combining the obtained copper-clad laminate with a different prepreg.

[Wiring Substrate]

Next, the wiring substrate in this embodiment will be explained.

The wiring substrate in this embodiment includes insulating layers and conductor layers arranged on both surfaces of the insulating layer or between the insulating layers, and the insulating layers are formed by containing the above-described resin composition. That is, the copper foil of the copper-clad laminate in the above-described embodiment is processed into a wiring pattern and a wiring substrate formed by including the copper-clad laminate having the wiring pattern can be exemplified.

Such a wiring substrate can be manufactured as follows, for example.

First, on the above-described copper-clad laminate, circuits and through-hole conductors are formed to manufacture an inner layer board. Thereafter, the prepreg and a conductive metal foil such as the copper foil (including the adhesive-attached copper foil) are laminated on the surfaces of this inner layer board to be formed while applying heat and pressure, and an obtained product is processed into a multilayer board and the wiring substrate is obtained. Another adhesive-attached copper foil can be further laminated and combined on this multilayer board, to thereby obtain a high multilayer board that is more highly multilayered.

Figure 3:
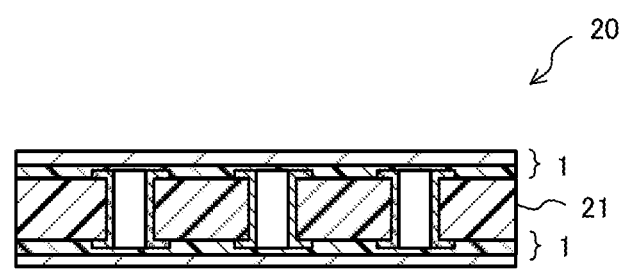
FIG. 3 is a cross-sectional view illustrating a schematic formation of a multilayer board that is one embodiment of the present invention.

FIG. 3 illustrates, as one example of a multilayer board in this embodiment, a cross-sectional view of a schematic formation of a multilayer board 20 in which the adhesive-attached copper foils 1 are each laminated on both surfaces of an inner layer board 21 on which circuits are formed.

In the forming while applying heat and pressure, forming and curing are performed simultaneously by using a heat press machine, for example. The forming while applying heat and pressure is preferably performed at 80 to 300° C. for one minute to 10 hours under a pressure of 0.1 to 50 MPa and more preferably performed at 150 to 250° C. for 60 minutes to five hours under a pressure of 0.5 to 6 MPa. Incidentally, the forming and the curing may be performed separately. For example, a laminate in a semi-cured state may be formed to then be cured completely by a treatment with a heat treatment machine.

By such a method, it is possible to obtain the wiring substrate in which conductor layers are arranged between a plurality of insulating layers. Further, a multilayer printed wiring substrate may be made by forming circuits and through holes on the conductive metal foils provided on the surfaces of this wiring substrate.

EXAMPLES

Next, this embodiment will be explained concretely with reference to examples. Incidentally, this embodiment is not limited to these examples. First, raw materials of the resin composition and materials for manufacturing the copper foil, which were used in this example and comparative examples, are described below.

<Resin Composition>
[Component (A)]
(A1): Methacryl-modified polyphenylene ether (produced by SABIC, product name: SA9000; number average molecular weight Mn 2,000 to 3,000, in the general formula (I), $R_3$, $R_4$, and $R_5$ represent a methyl group, $R_1$, $R_2$, $R_6$, and $R_7$ represent a hydrogen atom, Y represents a dimethylmethylene group, and Z represents a carbonyl group)
(A2): Methacryl-modified polyphenylene ether (produced by SABIC, product name: SA6000; number average molecular weight Mn 3,000 to 5,000, in the general formula (I), $R_3$, $R_4$, and $R_5$ represent a methyl group, $R_1$, $R_2$, $R_6$, and $R_7$ represent a hydrogen atom, Y represents a dimethylmethylene group, and Z represents a carbonyl group)
(A3): Polyphenylene ether (produced by SABIC, product name: SA90; number average molecular weight Mn 2,000 to 3,000)
[Component (B)]
(B1): Triallyl isocyanurate: TAICROS (produced by Evonik Degussa Co., Ltd., product name; content of diallyl isocyanurate 300 ppm)
[Component (C)]
(C1): α,α'-di-(t-butylperoxy)diisopropylbenzene: PERBUTYL P
[Component (D)]
(D1): Butadiene.styrene copolymer (produced by CRAY VALLEY, product name: RICON184; mass ratio (butadiene/styrene)=72/28)
[Others]
Silica: SFP-130MC (produced by Denki Kagaku Kogyo Kabushiki Kaisha, product name; average particle size 0.5 µm)
<Copper Foil>
[Copper Foil]
(Copper foil 1): FVO-WS (produced by Furukawa Electric Co., Ltd., product name; thickness 18 µm, surface roughness Rz (roughened surface) 1.1 µm)
(Copper foil 2): FZO-WS (produced by Furukawa Electric Co., Ltd., product name; thickness 18 µm, surface roughness Rz (roughened surface) 0.8 µm)
[Silane Coupling Agent]
(Methacrylic): 3-methacryloxypropylmethyldimethoxysilane
(Acrylic): 3-acryloxypropyltrimethoxysilane
(Isocyanurate): tris-(trimethoxysilyl propyl)isocyanurate
(Epoxy): 2-(3,4-epoxycyclohexyl)ethyltrimethoxysilane
(Amine): N-phenyl-3-aminopropyltrimethoxysilane
(Vinyl): vinyltrimethoxysilane Examples 1 to 10, Comparative Examples 1 to 6

As illustrated in Tables 1 to 2, a predetermined silane coupling agent was dissolved in a water to obtain an aqueous solution of 2.0 g/L. This aqueous solution was uniformly applied to a roughened surface of a chromate-treated electrolytic copper foil having a thickness of 18 µm (the copper foil 1 or copper foil 2) by a dipping method. Thereafter, the chromate-treated electrolytic copper foil was dried for four minutes at 100° C. to obtain a silane-coupling-treated copper foil.

Then, raw materials were mixed to have proportions illustrated in Tables 1 to 2 and a mixture was stirred at room temperature (25° C.) to obtain a resin composition. Then, the obtained resin composition was dissolved in a toluene to obtain a varnish. This varnish was applied to a roughened surface of the silane-coupling-treated copper foil. Thereafter, the varnish-applied copper foil was dried for four minutes at 100° C. to obtain an adhesive-attached copper foil having a resin layer (adhesive layer) having a thickness of 3 µm.

This adhesive-attached copper foil was overlaid on an upper surface and a lower surface of a prepreg (produced by KYOCERA Corporation, product name: TLP-596MN, thickness 100 µm). Thereafter, the prepreg with the adhesive-attached copper foils overlaid thereon was heated for 100 minutes at 195° C. under a pressure of 3 MPa to cure the resins in the adhesive-attached copper foils and the prepreg, and thereby a copper-clad laminate having a thickness of 0.14 mm was obtained.

Examples 11 to 14, Comparative Examples 7 to 9

As illustrated in Table 3, a predetermined silane coupling agent was dissolved in a water to obtain an aqueous solution of 2.0 g/L. This aqueous solution was uniformly applied to a roughened surface of a chromate-treated electrolytic copper foil having a thickness of 18 µm (the copper foil 1) by a dipping method. Thereafter, the chromate-treated electrolytic copper foil was dried for four minutes at 100° C. to obtain a silane-coupling-treated copper foil.

Then, raw materials were mixed to have proportions illustrated in Table 3 and a mixture was stirred at room temperature (25° C.) to obtain a resin composition. Then, the obtained resin composition was dissolved in a toluene to obtain a varnish. A glass cloth having a thickness of 100 µm (produced by Asahi Kasei Corp., product name: #2116) was immersed in this varnish and the glass cloth was impregnated with the varnish. Thereafter, the glass cloth impregnated with the varnish was dried for seven minutes at 130° C. to obtain a prepreg having a thickness of 10 µm. Incidentally, the ratio of the base to the prepreg is 60 mass %.

Eight pieces of the prepregs were overlaid on one another to manufacture a laminate. Further, the silane-coupling-treated copper foil obtained above was laminated on both surfaces of this laminate. Thereafter, the laminate with the silane-coupling-treated copper foils laminated thereon was heated for 75 minutes at 195° C. under a pressure of 4 MPa to cure the resins in the prepregs, and thereby a copper-clad laminate having a thickness of 0.8 mm was obtained.

Test Example

Then, the following evaluations were performed on the copper-clad laminates obtained in Examples 1 to 14 and Comparative examples 1 to 9 and wiring substrates using these copper-clad laminates. Results are illustrated in Tables 1 to 3 collectively.

(Peel Strength)

The peel strength (kN/m) of the copper-clad laminate was measured by performing a 90-degree peel test of the copper foil.

(Heat Resistance)

The copper-clad laminate was immersed in a solder at 288° C., 300° C., or 320° C. for five minutes to observe swollenness of the copper foils. Three pieces of the copper-clad laminates were observed and evaluated based on the following criteria.

"Excellent": swollenness did not occur on all the three at 320° C.

"Good": swollenness did not occur on all the three at 300° C.

"Poor": swollenness occurred on even one of them at 300° C.

(Reflow Resistance)

In the obtained copper-clad laminate, through holes were formed, and then circuits (wiring layers) and through-hole conductors were formed to obtain an inner layer board. This inner layer board and a prepreg (produced by KYOCERA Corporation, product name: TLP-596MN, 100 μm) were overlaid on each other to be heated at 190° C. at a pressure of 4 MPa, and thereby a 3.0 mm-wiring substrate was obtained. Regarding the reflow resistance, a test was performed by a pretreatment: 85° C./85%/168 h, under a reflow condition: Pb free reflow (260° C.) and the occurrence of delamination was confirmed by a scanning electron microscope.

"Excellent": no occurrence of delamination after 20 reflows
"Good": no occurrence of delamination after 10 reflows
"Poor": partial delamination occurred (Insulation Reliability)

In the obtained copper-clad laminate, through holes were formed, and then circuits (wiring layers) and through-hole conductors were formed to obtain an inner layer board. This inner layer board and a prepreg (produced by KYOCERA Corporation, product name: TLP-596MN, 100 μm) were overlaid on each other to be heated at 190° C. at a pressure of 4 MPa, and thereby a 3.0 mm-wiring substrate was obtained. An insulation property between the through holes was evaluated based on the following criteria by performing a test by a pretreatment: 10 cycles of Pb free reflow, under a condition: 65° C./85%/50 VDC and confirming insulation resistance.

"Excellent": $10^8 \Omega$ or more of insulation resistance was maintained after 2000 h "Good": $10^8 \Omega$ or more of insulation resistance was maintained after 1000 h "Poor": insulation resistance was $10^8 \Omega$ or less partly.

(Connection Reliability)

In the obtained copper-clad laminate, through holes were formed, and then circuits (wiring layers) and through-hole conductors were formed to obtain an inner layer board. This inner layer board and a prepreg (produced by KYOCERA Corporation, product name: TLP-596MN, 100 μm) were overlaid on each other to be heated at 190° C. at a pressure of 4 MPa, and thereby a 3.0 mm-wiring substrate was obtained.

Connectivity between the through-hole conductor and the wiring substrate was evaluated based on the following criteria by performing a test by a pretreatment: 10 cycles of Pb free reflow, under a condition: repetition of temperature cycles of −65° C.×30 minutes and 125° C.×30 minutes and confirming a cross section of the wiring substrate by a scanning electron microscope, and results are illustrated in the tables collectively.

"Excellent": the through-hole conductor and the wiring substrate are connected after 2000 cycles "Good": the through-hole conductor and the wiring substrate are connected after 1000 cycles "Poor": a part of the through-hole conductor and the wiring substrate are not connected

TABLE 1

| | | | Example | | | | | | | | | |
|---|---|---|---|---|---|---|---|---|---|---|---|---|
| | | | 1 | 2 | 3 | 4 | 5 | 6 | 7 | 8 | 9 | 10 |
| Resin composition (part by mass) | (A) | (A1) | 50 | 50 | 50 | 50 | 50 | — | 50 | 50 | — | 50 |
| | | (A2) | — | — | — | — | — | 50 | — | — | 50 | — |
| | | (A3) | — | — | — | — | — | — | — | — | — | — |
| | (B) | (B1) | 35 | 35 | 35 | 35 | 35 | 35 | 35 | 35 | 35 | 35 |
| | (C) | (C1) | 5 | 5 | 5 | 5 | 5 | 5 | 5 | 5 | 5 | 5 |
| | (D) | (D1) | 10 | 10 | 10 | 10 | 10 | 10 | 10 | 10 | 10 | 10 |
| | | (Others) | 30 | 30 | 30 | 30 | 30 | 30 | 30 | 30 | 30 | 30 |
| Treated copper foil | Copper foil | | Copper foil 1 | | | | | | Copper foil 2 | Copper foil 1 | Copper foil 2 | |
| | Surface roughness Rz | | | | | 1.1 μm | | | | 0.8 μm | 1.1 μm | 0.8 μm |
| | Silane coupling agent | | Methacrylic | | | | | Acrylic | | Isocyanurate | | |
| Properties | Peel strength | | 0.7 | 0.7 | 0.7 | 0.7 | 0.9 | 0.9 | 0.7 | 0.9 | 0.9 | 0.7 |
| | Heat resistance | | Excellent | Good | Excellent | Good | Excellent | Excellent | Excellent | Excellent | Excellent | Excellent |
| | Reflow resistance | | Excellent | Excellent | Excellent | Excellent | Excellent | Good | Good | Excellent | Good | Good |
| | Insulation reliability | | Excellent | Excellent | Excellent | Excellent | Excellent | Good | Good | Excellent | Good | Good |
| | Connection reliability | | Excellent | Excellent | Excellent | Excellent | Excellent | Good | Good | Excellent | Good | Good |

TABLE 2

| | | | Comparative example | | | | | |
|---|---|---|---|---|---|---|---|---|
| | | | 1 | 2 | 3 | 4 | 5 | 6 |
| Resin composition (part by mass) | (A) | (A1) | 50 | — | 50 | — | 50 | — |
| | | (A2) | — | — | — | — | — | — |
| | | (A3) | — | 50 | — | 50 | — | 50 |
| | (B) | (B1) | 35 | 35 | 35 | 35 | 35 | 35 |
| | (C) | (C1) | 5 | 5 | 5 | 5 | 5 | 5 |
| | (D) | (D1) | 10 | 10 | 10 | 10 | 10 | 10 |
| | (Others) | | 30 | 30 | 30 | 30 | 30 | 30 |
| Treated copper foil | Copper foil | | | | Copper foil 1 | | | |
| | Surface roughness Rz | | | | 1.1 μm | | | |
| | Silane coupling agent | | Epoxy | | Amine | | Vinyl | |
| Properties | Peel strength | | 0.2 | 0.9 | 0.2 | 0.9 | 0.7 | 0.9 |
| | Heat resistance | | Poor | Excellent | Good | Good | Poor | Good |
| | Reflow resistance | | Poor | Good | Good | Good | Poor | Good |
| | Insulation reliability | | Poor | Good | Poor | Good | Good | Good |
| | Connection reliability | | Poor | Good | Good | Good | Poor | Good |

TABLE 3

| | | | Example | | | | Comparative example | | |
|---|---|---|---|---|---|---|---|---|---|
| | | | 11 | 12 | 13 | 14 | 7 | 8 | 9 |
| Resin composition (part by mass) | (A) | (A1) | 50 | 50 | 50 | 50 | 50 | 50 | 50 |
| | | (A2) | — | — | — | — | — | — | — |
| | | (A3) | — | — | — | — | — | — | — |
| | (B) | (B1) | 35 | 35 | 35 | 35 | 35 | 35 | 35 |
| | (C) | (C1) | 5 | 5 | 5 | 5 | 5 | 5 | 5 |
| | (D) | (D1) | 10 | 10 | 10 | 10 | 10 | 10 | 10 |
| | (Others) | | 30 | 30 | 30 | 30 | 30 | 30 | 30 |
| Treated copper foil | Type | | | | Copper foil 1 | | | | |
| | Surface roughness Rz | | | | 1.1 μm | | | | |
| | Silane coupling agent | | Methacrylic | | Acrylic | Isocyanurate | Epoxy | Amine | Vinyl |
| Properties | Peel strength | | 0.7 | 0.7 | 0.9 | 0.9 | 0.2 | 0.2 | 0.7 |
| | Heat resistance | | Excellent | Good | Excellent | Excellent | Poor | Good | Poor |
| | Reflow resistance | | Excellent | Excellent | Excellent | Excellent | Poor | Good | Poor |
| | Insulation reliability | | Excellent | Excellent | Excellent | Excellent | Poor | Poor | Good |
| | Connection reliability | | Excellent | Excellent | Excellent | Excellent | Poor | Good | Poor |

As is clear from Tables 1 to 3, it is possible to increase, of the copper-clad laminate that uses the adhesive-attached copper foils with the resin composition containing specific polyphenylene ether, a cyanurate compound, organic peroxide, and a butadiene.styrene copolymer provided on a roughened surface of the copper foil having a roughened surface surface-treated by one of methacrylic silane, acrylic silane, and isocyanurate silane, a peel strength and heat resistance. Further, when a circuit substrate is formed using this copper-clad laminate, it is possible to improve reflow resistance, insulation reliability, and connection reliability of the circuit substrate.

What is claimed is:

1. An adhesive-attached copper foil comprising:
   a copper foil having a roughened surface on one surface of the copper foil, the roughened surface having a silane coupling agent layer surface-treated by methacrylic silane, acrylic silane or isocyanurate silane; and
   an adhesive layer formed on the roughened surface and made of a resin composition containing, as a main component thereof, modified polyphenylene ether resulting from modification of a hydroxyl group present at the end of the main chain with an ethylenically unsaturated compound.

2. The adhesive-attached copper foil according to claim 1, wherein
   the resin composition contains:
   (A) modified polyphenylene ether resulting from modification of a hydroxyl group present at the end of the main chain with an ethylenically unsaturated compound;
   (B) a cyanurate compound containing at least one type of triallyl isocyanurate and triallyl cyanurate; and
   (C) organic peroxide,
   the modified polyphenylene ether (A) contains polyphenylene ether represented by the following general formula (I)

[Chemical formula 1]

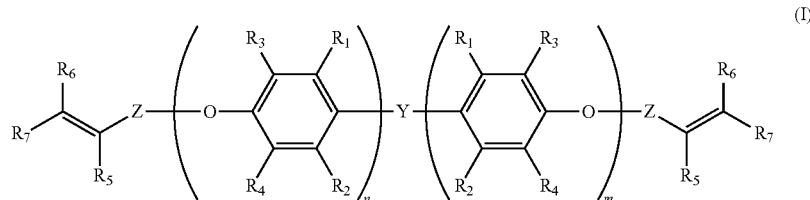

(I)

where in the formula, $R_1$ to $R_7$ are independently a hydrogen atom, a straight-chain or branched-chain alkyl group having a carbon number of 1 to 8, a straight-chain or branched-chain alkenyl group having a carbon number of 2 to 8, a straight-chain or branched-chain alkynyl group having a carbon number of 2 to 8, or an aryl group having a carbon number of 6 to 10, Y is an oxygen atom, a methylene group, or a dimethylmethylene group, Z is a carbonyl group, a thiocarbonyl group, a methylene group, an ethylene group, a trimethylene group, or a tetramethylene group, n is an integer of 1 to 100, m is an integer of 1 to 100, and n+m is an integer of 2 to 200, and a content ratio of the organic peroxide (C) is 0.5 to 20 mass % when the total content of the modified polyphenylene ether (A), the cyanurate compound (B), and the organic peroxide (C) is set to 100 mass %.

3. The adhesive-attached copper foil according to claim 2, wherein
the resin composition further contains a butadiene.styrene copolymer (D).

4. The adhesive-attached copper foil according to claim 1, wherein
a thickness of the copper foil is 5 to 70 µm, and
surface roughness Rz of the roughened surface is 2 to 20% of the thickness.

5. The adhesive-attached copper foil according to claim 4, wherein
the surface roughness Rz is 0.1 to 2.0 µm.

6. A copper-clad laminate comprising: a copper foil having a roughened surface on one surface of the copper foil, the roughened surface having a silane coupling agent layer surface-treated by methacrylic silane, acrylic silane, or isocyanurate silane; and a prepreg laminated on the roughened surface and made by impregnating a glass cloth with a resin composition containing, as a main component thereof, modified polyphenylene ether resulting from modification of a hydroxyl group present at the end of the main chain with an ethylenically unsaturated compound.

7. The copper-clad laminate according to claim 6, wherein the resin composition contains:
(A) modified polyphenylene ether resulting from modification of a hydroxyl group present at the end of the main chain with an ethylenically unsaturated compound;
(B) a cyanurate compound containing at least one type of triallyl isocyanurate and triallyl cyanurate; and
(C) organic peroxide,
the modified polyphenylene ether (A) contains polyphenylene ether represented by the following general formula (I)

[Chemical formula 1]

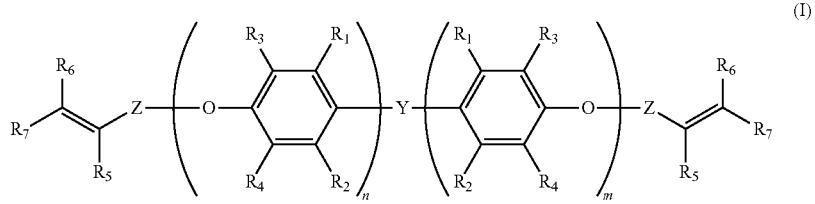

(I)

where in the formula, $R_1$ to $R_7$ are independently a hydrogen atom, a straight-chain or branched-chain alkyl group having a carbon number of 1 to 8, a straight-chain or branched-chain alkenyl group having a carbon number of 2 to 8, a straight-chain or branched-chain alkynyl group having a carbon number of 2 to 8, or an aryl group having a carbon number of 6 to 10, Y is an oxygen atom, a methylene group, or a dimethylmethylene group, Z is a carbonyl group, a thiocarbonyl group, a methylene group, an ethylene group, a trimethylene group, or a tetramethylene group, n is an integer of 1 to 100, m is an integer of 1 to 100, and n+m is an integer of 2 to 200, and
a content ratio of the organic peroxide (C) is 0.5 to 20 mass % when the total content of the modified polyphenylene ether (A), the cyanurate compound (B), and the organic peroxide (C) is set to 100 mass %.

8. A wiring substrate comprising the copper-clad laminate according to claim 6, the copper foil processed into a wiring pattern.

9. A copper-clad laminate comprising:
a copper foil having a roughened surface on one surface of the copper foil, the roughened surface having a silane coupling agent layer surface-treated by methacrylic silane, acrylic silane, or isocyanurate silane;
an adhesive layer formed on the roughened surface and made of a resin composition containing, as a main component thereof, modified polyphenylene ether resulting from modification of a hydroxyl group present at the end of the main chain with an ethylenically unsaturated compound; and a prepreg laminated on the adhesive layer and made by impregnating a glass cloth with a resin composition containing, as a main component thereof, modified polyphenylene ether resulting from modification of a hydroxyl group present at the end of the main chain with an ethylenically unsaturated compound.

* * * * *